US006898362B2

(12) United States Patent
Forbes et al.

(10) Patent No.: US 6,898,362 B2
(45) Date of Patent: May 24, 2005

(54) THREE-DIMENSIONAL PHOTONIC CRYSTAL WAVEGUIDE STRUCTURE AND METHOD

(75) Inventors: Leonard Forbes, Corvallis, OR (US); Joseph E. Geusic, Berkeley Heights, NJ (US)

(73) Assignee: Micron Technology Inc., Boise, ID (US)

( * ) Notice: Subject to any disclaimer, the term of this patent is extended or adjusted under 35 U.S.C. 154(b) by 263 days.

(21) Appl. No.: 10/052,952

(22) Filed: Jan. 17, 2002

(65) Prior Publication Data

US 2003/0133683 A1 Jul. 17, 2003

(51) Int. Cl.$^7$ .............................................. G02B 6/10
(52) U.S. Cl. ..................................... 385/132; 385/122
(58) Field of Search ......................... 385/122, 130–132

(56) References Cited

U.S. PATENT DOCUMENTS

| 4,241,359 A | 12/1980 | Izumi et al. ................. 257/386 |
| 4,589,928 A | 5/1986 | Dalton et al. ................ 438/142 |
| 4,717,681 A | 1/1988 | Curran ........................ 438/314 |
| 5,426,061 A | 6/1995 | Sopori ........................ 438/475 |
| 5,443,661 A | 8/1995 | Oguro et al. ............... 148/33.5 |
| 5,461,243 A | 10/1995 | Ek et al. ...................... 257/190 |

(Continued)

FOREIGN PATENT DOCUMENTS

| EP | 434984 | 9/1991 | .......... H01L/21/322 |
| EP | 1030196 | 8/2000 | ............ G02B/5/20 |
| EP | 1085352 | 3/2001 | ............ G02B/6/12 |
| JP | 2001-093887 | 4/2001 | ....... H01L/21/3065 |
| WO | WO 98/35248 | 8/1998 | ........... G02B/6/138 |
| WO | WO-WO02097982 | 12/2002 | ............ H03G/3/10 |

OTHER PUBLICATIONS

Birner, A , et al., "Macroporous silicon: a two–dimensional photonic bandgap material suitable for the near–infrared spectral range", *Physica Status Solidi A;65(1)*, (Jan. 16, 1998),111–117.

Birner, A. , et al., "Silicon–Based Photonic Crystals", *Advanced Materials, 13(6)*, (Mar. 2001),377–388.

Blanco, A , et al., "Large–scale synthesis of a silicon photonic crystal with a complete three–dimensional bandgap near 1.5 micrometres", *Nature, 405(6785)*, (May 25, 2000),437–440.

Blanford, C F., et al., "Gems of Chemistry and Physics: Macroporous Metal Oxides with 3D Order", *Advanced Materials, 13(6)*, (Mar. 2001).

Edrington, A C., et al., "Polymer–Based Photonic Crystals", *Advanced Materials, 13(6)*, (Mar. 2001),421–425.

(Continued)

*Primary Examiner*—Akm Enayet Ullah
*Assistant Examiner*—Jerry T Rahll
(74) *Attorney, Agent, or Firm*—Schwegman, Lundberg, Woessner & Kluth, P.A.

(57) ABSTRACT

A waveguide structure formed with a three-dimensional (3D) photonic crystal is disclosed. The 3D photonic crystal comprises a periodic array of voids formed in a solid substrate. The voids are arranged to create a complete photonic bandgap. The voids may be formed using a technique called "surface transformation," which involves forming holes in the substrate surface, and annealing the substrate to initiate migration of the substrate near the surface to form voids in the substrate. A channel capable of transmitting radiation corresponding to the complete bandgap is formed in the 3D photonic crystal, thus forming the waveguide. The waveguide may be formed by interfacing two 3D photonic crystal regions, with at least one of the regions having a channel formed therein. The bandgap wavelength can be chosen by arranging the periodic array of voids to have a lattice constant a fraction of the bandgap wavelength.

49 Claims, 10 Drawing Sheets

U.S. PATENT DOCUMENTS

| | | | |
|---|---|---|---|
| 5,471,180 A | 11/1995 | Brommer et al. | 333/202 |
| 5,526,449 A | 6/1996 | Meade et al. | 385/14 |
| 5,646,053 A | 7/1997 | Schepis et al. | 438/402 |
| 5,661,044 A | 8/1997 | Holland et al. | 438/766 |
| 5,691,230 A | 11/1997 | Forbes | 437/62 |
| 5,739,796 A | 4/1998 | Jasper et al. | 343/895 |
| 5,759,898 A | 6/1998 | Ek et al. | 438/291 |
| 5,773,152 A | 6/1998 | Okonogi | 428/446 |
| 5,789,859 A | 8/1998 | Watkins et al. | 313/495 |
| 5,840,590 A | 11/1998 | Myers, Jr. et al. | 438/471 |
| 5,879,996 A | 3/1999 | Forbes | 438/289 |
| 5,963,817 A | 10/1999 | Chu et al. | 438/410 |
| 5,997,378 A | 12/1999 | Dynka et al. | 445/25 |
| 5,999,308 A | 12/1999 | Nelson et al. | 359/321 |
| 6,001,711 A | 12/1999 | Hashimoto | 438/473 |
| 6,022,793 A | 2/2000 | Wijaranakula et al. | 438/473 |
| 6,054,808 A | 4/2000 | Watkins et al. | 313/495 |
| 6,075,640 A | 6/2000 | Nelson | 359/239 |
| 6,083,324 A | 7/2000 | Henley et al. | 148/33.2 |
| 6,093,623 A | 7/2000 | Forbes | 438/455 |
| 6,093,624 A | 7/2000 | Letavic et al. | 438/462 |
| 6,127,777 A | 10/2000 | Watkins et al. | 313/554 |
| 6,139,626 A | 10/2000 | Norris et al. | 117/68 |
| 6,172,456 B1 | 1/2001 | Cathey et al. | 313/495 |
| 6,174,784 B1 | 1/2001 | Forbes | 438/405 |
| 6,204,145 B1 | 3/2001 | Noble | 438/412 |
| 6,228,694 B1 | 5/2001 | Doyle et al. | 438/199 |
| 6,251,751 B1 | 6/2001 | Chu et al. | 438/439 |
| 6,274,460 B1 | 8/2001 | Delgado et al. | 438/476 |
| 6,309,950 B1 | 10/2001 | Forbes | 438/455 |
| 6,315,826 B1 | 11/2001 | Muramatsu | 117/95 |
| 6,338,805 B1 | 1/2002 | Anderson | 216/89 |
| 6,339,011 B1 | 1/2002 | Gonzalez et al. | 438/473 |
| 6,368,938 B1 | 4/2002 | Usenko | 438/407 |
| 6,376,336 B1 | 4/2002 | Buynoski | 438/476 |
| 6,377,070 B1 | 4/2002 | Forbes | 326/41 |
| 6,391,738 B2 | 5/2002 | Moore | 438/402 |
| 6,423,613 B1 | 7/2002 | Geusic | 438/455 |
| 6,424,001 B1 | 7/2002 | Forbes et al. | 257/315 |
| 6,425,713 B2 | 7/2002 | Fox et al. | 359/322 |
| 6,436,187 B1 | 8/2002 | Patel et al. | 117/68 |
| 6,444,534 B1 | 9/2002 | Maszara | 438/311 |
| 6,448,601 B1 | 9/2002 | Forbes et al. | 257/302 |
| 6,478,883 B1 | 11/2002 | Tamatsuka et al. | 148/33.2 |
| 6,496,034 B2 | 12/2002 | Forbes et al. | 326/41 |
| 6,531,727 B2 | 3/2003 | Forbes et al. | 257/302 |
| 6,538,330 B1 | 3/2003 | Forbes | 257/777 |
| 6,542,682 B2 * | 4/2003 | Cotteverte et al. | 385/125 |
| 6,559,491 B2 | 5/2003 | Forbes et al. | 257/296 |
| 6,566,682 B2 | 5/2003 | Forbes | 257/51 |
| 6,582,512 B2 | 6/2003 | Geusic et al. | 117/3 |
| 6,593,625 B2 | 7/2003 | Christiansen et al. | 257/347 |
| 6,597,203 B2 | 7/2003 | Forbes | 326/98 |
| 6,630,713 B2 | 10/2003 | Geusic | 257/347 |
| 6,649,476 B2 | 11/2003 | Forbes | 438/268 |
| 2002/0001965 A1 | 1/2002 | Forbes | 438/734 |
| 2002/0062782 A1 | 5/2002 | Norris et al. | 117/3 |
| 2002/0070421 A1 | 6/2002 | Ashburn | 257/510 |
| 2002/0175330 A1 | 11/2002 | Geusic et al. | 257/74 |
| 2002/0185686 A1 | 12/2002 | Christiansen., et al. | 257/347 |
| 2003/0027406 A1 | 2/2003 | Malone | 438/471 |
| 2003/0201468 A1 | 10/2003 | Christiansen., et al. | 257/200 |
| 2003/0218189 A1 | 11/2003 | Christiansen et al. | 257/200 |
| 2003/0227072 A1 | 12/2003 | Forbes | 257/616 |

OTHER PUBLICATIONS

Ho, K , et al., "Existence of a photonic gap in periodic dielectric structures", *Physical Review Letters, 65(25)*, (Dec. 17, 1990),3152–3155.

Holland, Brian T., et al., "Synthesis of Macroporous Mineral with Highly Ordered Three–Dimensional Arrays of Spheroidal Voids", *Science, 281*, (Jul. 24, 1998),538–540.

Jiang, P , et al., "The Fabrication and Bandgap Engineering of Photonic Multilayers", *Advanced Materials, 13(6)*, (Mar. 2001),389–393.

Joannopoulos, J D., et al., "Photonic crystals : molding the flow of light", *Princeton, N.J. : Princeton University Press*, (1995),6.

John, S , et al., "Photonic bandgap formation and tunability in certain self–organizing systems", *Journal of Lightwave Technology, 17(11)*, (Nov. 1999),1931–1943.

Johnson, S G., et al., "Guided modes in photonic crystal slabs", *Physical Review B(Condened Matter), 60(8)*, (Aug. 15, 1999),5751–9.

Li, Z Y., et al., "Photonic Bandgaps in Disordered Inverse–Opal Photonic Crystals", *Advanced Materials, 13(6)*, (Mar. 2001),443–436.

Lin, Shawn Yu , et al., "A three–dimensional optical photonic crystal", *Journal of Lightwave Technology, 17(11)*, (Nov. 1999),1944–1947.

Loncar, M , et al., "Waveguiding in planar photonic crystals", *Applied Physics Letters, 77(13)*, (Sep. 25, 2000), 1937–1939.

Lu, Y , et al., "Three–Dimensional Photonic Crystals with Non–spherical Colloids as Building Blocks", *Advanced Materials, 13(6)*, (Mar. 2001),415–420.

Manoharan, V N., "Photonic Crystals from Emulsion Templates",*Advanced Materails, 13(6)*, (Mar. 2001),447–450.

Miguez, H , et al., "Synthesis and Photonic Bandgap Characterization of Polymer Inverse Opals", *Advanced Materials, 13(6)*, (Mar. 2001),393–396.

Mitsutake, K , et al., "Theoretical Study on the Formation Process of Empty Space in Silicon (ESS)", *2000 International Conference on Solid State Devices and Materials*, (2000),198–199.

Mizushima, I. , et al., "Empty–space–in–silicon technique for fabricating a silicon–on–nothing structure", *Applied Physics Letters, 77(20)*, American Institute of Physics, NY,(Nov. 13, 2000),3290–3292.

Ni, P , et al., "Synthetic SiO2 Opals", *Advanced Materials, 13(6)*, (Mar. 2001),437–441.

Nichols, F A., "Surface–(interace) and volume–diffusion contributions to morphological changes driven by capillarity", *Transactions of the American Institute of Mining, Metallurgical and Petroleum Engineers, 233(10)*, (1965), 1840–8.

Norris, D J., et al., "Chemical Approaches to Three–Dimensional Semiconductor Photonic Crystals", *Advanced Materials, 13(6)*, (Mar. 2001),371–376.

Sato, T , "A new substrate engineering for the formation of empty space in silicon (ESS) induced by silicon surface migration", *International Electron Devices Meeting 1999. Technical Digest*, (1999),517–20.

Smith, C J., et al., "Low–loss channel waveguides with two–dimensional photonic crystal boundaries", *Applied Physics Letters, 77(18)*, (Oct. 30, 2000),2813–2815.

Subramania, G , et al., *Advanced Materials, 13(6)*, Inverse Face–Centered Cubic Thin Film Photonic Crystals,(Mar. 2001),443–446.

Tessier, P M., et al., "Structured Metallic Films for Optical and Spectroscopic Applications via Colloidal Crystal Templating", *Advanced Materials, 13(6)*, (Mar. 2001),396–400.

Xia, Y , "Photonic Crystals", *Advanced Materials, 13(6)*, (Mar. 2001),369.

Xia, Y , et al., "Self–Assembly Approaches to Three–Dimensional Photonic Crystals", *Advanced Materials, 13(6)*, (Mar. 2001),409–413.

Yablonovitch, E , "Inhibited spontaneous emission in solid–state physics and electronics", *Physical Review Letters, 58(20)*, (May 18, 1987),2059–62.

Yang, P , et al., "Patterning Porous Oxides within Microchannel Networks", *Advanced Materials, 13(6)*, (Mar. 2001),427–431.

"Cornell Demonstrates a Universal Substrates", *Compound Semiconductor, 3(2)*, (Mar./Apr. 1997), 27–29.

Abe, T, "Silicon Wafer–Bonding Process Technology for SOI Structures", *Extended Abstracts of the 22nd (1990 International) Conference on Solid State Devices and Materials*, (1990), 853–856.

Auberton–Herve, A J., "SOI: Materials to Systems", *International Electron Devices Meeting Technical Digest*, (1996), 3–10.

Autumn, Kellar, et al., "Adhesive force of a single gecko foot–hair", *Nature, 405(6787)*, (Jun. 2000), 681–685.

Autumn, Kellar, et al., "Evidence for van der Waals adhesion in gecko setae.", *Proceedings of the National Academy of Science U S A.: 99(19)*, (Sep. 17, 2002), 12252–6.

Baginski, T. A., "Back–side germanium ion implantation gettering of silicon", *Journal of the Electrochemical Society, 135(7)*, Dept of Electrical Engineering, Auburn Univ, AL,(Jul. 1988),1842–3.

Bronner, G. B., et al., "Physical Modeling of Backside Gettering", *Impurity Diffusion and Gettering in Silicon Symposium*,Sponsor: Mater. Res. Soc, Nov. 1984, Boston, MA,(1985),27–30.

Berti, M., "Composition and Structure of Si–Ge Layers Produced by Ion Implantation and Laser Melting", *Journal of Materials Research, 6(10)*, (Oct. 1991),2120–2126.

Berti, M. , "Laser Induced Epitaxial Regrowth of Si–xGex/Si Layers Produced by Ge Ion Implantation", *Applied Surface Science, 43*, (1989), 158–164.

Bialas, F., et al., "Intrinsic Gettering of 300 mm CZ Wafers", *Microelectronic Engineering, 561(1–2)*, (May 2001), 157–63.

Biever, Celeste , "Secret of strained silicon' revealed: behind closed doors, Intel has perfected a novel way to improve chip performance.", *New Scientist, 180(i2426–2428)*, (Dec. 20, 2003),27.

Binns, M. J., et al., "The Realization of Uniform and Reliable Intrinsic Gettering in 200mm P–& P/P Wafers for a Low Thermal Budget 0.18 mu m Advanced CMOS Logic Process", *Diffusion and Defect Data Pt.B: Solid State Phenomena, 82–84*, (2001),387–92.

Brown, Chappell, "Bonding twist hints at universal substrates", EETimes, (1997), 2 pages.

Bruel, M , et al., "Smart–Cut: a new silicon on insulator material technology based on hydrogen implantation and wafer bonding", *Japanese Journal of Applied Physics, Part 1 (Regular Papers, Short Notes & Review Papers), 36(3B)*, (1997), 1636–1641.

Chen, Xiangdong , et al., "Vertical P–MOSFETs with heterjunction between source/drain and channel", *IEEE Device Research Conference*, (2000),25–26.

Chilton, B T., et al., "Solid phase Epitaxial regrowth of strained Si(1–x)Ge(x)/Si strained layer structures amorphized by ion implantation", *Applied Physics Letters, 54(1)*, (Jan. 2, 1989), 42–44.

Choe, K. S., et al., "Minority–Carrier Lifetime Optimization in Silicon MOS Devices by Intrinsic Gettering", *Journal of Crystal Growth, 218(2–4)*, (Sep. 2000), 239–44.

Clark, Don , et al., "Intel unveils tiny new transistors: Process handles circuits 1/2000th the width of a human hair", *The Wall Street Journal*, (Aug. 13, 2002),3 pages.

Clifton, P A., et al., "A Process for strained silicon n–channel HMOSFETs", *Essderc'96. Proceedings of the 26th European Solid State Device Research Conference*, (Sep. 1996), 519–22.

Dubbelday , W B., et al., "Oscillatory strain relaxation in solid phase epitaxially regrown silicon on sapphire", *Proceedings of the First International Workshop Lattice Mismatched Thin Films*, (Sep. 13–15, 1998), 13–17.

Fischetti, M V., et al., "Band Structure, deformation potentials, and Carrier mobility in strained Si, Ge, and SiGe alloys", *Journal of Applied Physics, 80(4)*, (Aug. 15, 1996), 2234–2252.

Fournel, F , et al., "Ultra High Precision Of The Tilt/Twist Misorientation Angels In Silicon/Silicon Direct Wafer Bonding", *Abstract –Electronic Materials Conference*, (Jun. 2002),9.

Garcia, G A., et al., "High–quality CMOS in thin (100 nm) silicon on sapphire", *IEEE Electron Device Letters, 9(1)*, (Jan. 1988),32–34.

Godbole, H., et al., "An Investigation of Bulk Stacking Faults in Silicon Using Photocapacitance Transient Spectroscophy", *Materials Letters, 8(6–7)*, Dept of Electr & Comput Engr, Oregon State Univ, Corvallis OR, (Jul. 1989), 201–3.

Gong, S. S., et al., "Implantation Gettering in Silicon", *Soilid–State Electronics, 30(20)*, (Feb. 1987),209–11.

Graf, D., et al., "300 mm epi pp–wafer: is there sufficient gettering?", *High Purity Silicon VI. Proceedings of the Sixth International Symposium (Electrochemical Society Proceedings vol. 200–17) (SPIE vol. 4218)*, (2000), 319–30.

Haddad, H. , et al., "Carbon Doping Effects on Hot Electron Trapping", *28th Annual Proceedings. Reliability Physics 1990*, (Mar. 1990), 288–9.

Haddad, H. , et al., "Electrical Activity of Bulk Stacking Faults in Silicon", *Materials Letters, 7(3)*, Hewlett–Packard Northwest Integrated Circuits Div, Corvallis OR,(Sep. 1988),99–101.

Harendt, Christine , "Silicon on Insulator Material by Wafer Bonding", *Journal of Electronic Materials, 20(3)*, (Mar. 1991),267–77.

Iyer, S S., "Separation by Plasma Implantation of Oxygen (SPIMOX) operational phase space", *IEEE trans. on Plasma Science, 25*, (1997), 1128–1135.

Kalavade, Pranav , et al., "A novel sub–10 nm Transistor", *58th DRC. Device Research Conferrence. Conference Digest*, (Jun. 19–21, 2000),71–72.

Kang, J. S., et al., "Gettering in Silicon", *Journal of Applied Physics, 65(8)*, Center for Solid State Electron Res., Arizona State Univ., Tempe, AZ,(Apr. 15, 1989),2974–85.

Kostrezewa, M , et al., "Testing the Feasibility of strain relaxed InAsP and InGaAs compliant substrates", *EMC 2003 International Conference Indium Phosphide and Related Materials. Conference Proceedings*, Other authors: G. Grenet et al,(Jun. 2003),8–9.

Kung, C. Y., et al., "The effect of carbon on oxygen precipitation in high carbon CZ silicon crystals", *Materials Research Bulletin, 18(12)*, Silicon Materials Div., Fairchild Camera & Instrument Corp, Healdsburg, CA,(Dec. 1983), 1437–41.

Lasky, J. B., "Wafer Bonding for Silicon–on–Insulator Technologies", *Appllied Physics Letters, 48(1)*, (Jan. 6, 1986), 78–80.

Li, Y. X., et al., "New instrinsic gettering process in Czochralski–silicon wafer", *6th International Conference on Solid–State and Integrated Circuit Technology Proceedings,* 1(1), (2001),277–9.

Loo, Y L., et al., "Contact Printing With Nanometer Resolution", *Device Research Conference,* (Jun. 2001),149–150.

Lu, D., "Bonding Silicon Wafers by Use of Electrostatic Fields Followed by Rapid Thremal Heating", *Materials Letters, 4(11),* (Oct. 1986),461–464.

Mizuno, T, et al., "Advanced SOI–MOSFETs with Strained–Si Channel for High Speed CMOS Electron/Hole Mobility Enhancement", *2000 Symposium on VLSI Technology. Digest of Technical Papers.* (2000),210–211.

Moran, Peter, "Strain Relaxation in Wafer–Bonded SiGe/Si Heterostructures Due to Viscous Flow of an Underlying Borosilicate Glass", *Electronic Materials Conference, Santa Barbara, Jun. 2002,* Abstract,(Jun. 2002),pp. 8–9.

Mumola, P, B., et al., "Recent advances in thining of bonded SOI wafers by plasma assisted chemical etching", *Proceedings of the Third International Symposium on Semiconductor Wafer Bonding: Physics and Applications,* (1995),28–32.

Nayak, D.K., "High performance GeSi quantum–well PMOS on SIMOX", *International Electron Devices Meeting 1992. Technical Digest,* (1992),777–80.

O'Neill, A G., et al., "High speed deep su–micron MOSFET using high mobility strained Silicon channel", *ESSDREC '95. Proceedings of the 25th European Solid State Device Research Conference,* (Sep. 1995),109–12.

OMI, Hiroo, et al., "Semiconductor Surface with Strain Control", http://www.brl.ntt.co.jp/J/kouhou/katsudou/report00/E/report04 e.html, (Jan. 2004).

Or, B S., et al., "Annealing effects of carbon in n–channel LDD MOSFETs", *IEEE Electron Device Letters, 12(11),* Dept of Electrical & Computing Engr, Oregon State Univ, Corvallis OR,(Nov. 1991),596–8.

Ouyang, Q, et al., "Bandgap Engineering in Deep Submicron Vertical pMOSFETs", *IEEE 58th DRC. Device Research Conference. Conference Digest,* (2000),27–28.

Paine, D. C., "The Growth of Strained Si–xGex Alloys on (100) Silicon Using Solid Phase Epitaxy", *Journal of Materials Research, 5(5),* (May 1990),1023–1031.

People, R., "Calculation of critical layer thickness versus lattice mismatch for GexSi1–x/Si strained–layer heterostructures", *Applied Physics Letters, 47(3),* (Aug. 1, 1985), 322–4.

Rim, Kern, et al., "Fabrication and analysis of deep submicron strained–Si n–MOSFET's", *IEEE Transactions on Electron Devices, 47(7),* (Jul. 2000),1406–1415.

Rim, Kern, et al., "Strained Si NMOSFETs for High Performance CMOS Technology", *2001 Symposium on VLSI Technology. Digest of Technical Papers,* (2001),59–60.

Rim, Kern, et al., "Transconductance enhancement in deep Submicron strained Si n–MOSFETs", *International Electron Devices Meeting 1998. Technical Digest,* (1998),707–710.

Rubin, L, et al., "Effective gettering of oxygen by high dose, high energy boron buried layers", *1998 International Conference on Ion Implantation Technology Proceedings, 2(2),* (1998),1010–13.

Sato, T, "Trench transformation technology using hydrogen annealing for realizing highly reliable device structure with thin dielectric films", *1998 Symposium on VLSI Technology Digest of Technical Papers,* (1998),206–7.

Sugiyama, N, et al., "Formation of Strained–silicon layer on thin relaxed–SiGe/SiO/sub 2//Si structure using SIMOX technology", *Thin Solid Films, 369(1–2),* (Jul. 2000),199–202.

Takagi, Shin–ichi, "Strained–Si–and SiGe–On–Insulator (Strained–SOI and SGOI) MOSFETs for High Performance/Low Power CMOS Application", *IEEE Device Research Conference, 2002. 60th DRC. Conference Digest,* (2002), 37–40.

Tan, T. Y., et al., "Intrinsic gettering by oxide precipitate induced dislocations in Czochralski Si", *Applied Physics Letters, 30(4),* IBM system Products Div., Essex Junction, VT,(Feb. 15, 1977),175–6.

Verdonckt–Venderbroek., Sophie, et al., "SiGe–Channel Heterjunction p–MOSFETs", *IEEE International Electron Devices, 41(1),* (Jan. 1994),90–101.

Welser, F. D., et al., "Strain dependence of the performance enhancement in strained–Si n–MOSFETs", *IEEE International Electron Devices Meeting 1994. Technical Digest,* (Dec.11–14, 1994),373–376.

Whitwer, J, et al., "DLTS Characterization of precipitation induced microdefects", *Materials Issues in Silicon Intergrated Circuit Processing Symposium,* (Apr. 1986),53–57.

Wijaranakula, W., et al., "Effect of Pre–and Postepitaxial Deposition Annealing on Oxygen Precipitation in Silicon", *Journal of Materials Research, 1(5),* Dept of Electr & Comput Eng, Oregon State Univ, Corvallis, OR,(Sep.–Oct. 1986),698–704.

Wijaranakula, W., et al., "Effect of preanneal heat treatment on oxygen precipitation in expitaxial silicon", *Materials Issues in Silicon Integrated Circuit Processing Symposium,* (Apr. 1986),139–44.

Wijaranakula, W., et al., "Internal Gettering Heat Treatments and Oxygen Precipitation in Expitaxial Silicon Wafers", *Journal of Materials Research, 1(5),* Dept of Electr & Comput Eng, Oregon State Univ, Corvallis, OR,(Sep.–Oct. 1986),693–7.

Wijaranakula, W., et al., "Oxygen precipitation in p/p+(100) epitaxial silicon material", *Journal of the Electrochemical Society, 134(9),* SEH America, Inc., Mater. Characterization Lab., Vancouver, WA,(Sep. 1987),2310–16.

Xuan, Peiqi, et al., "60nm Planarized Ultra–thin Body Solid Phase Epitaxy MOSFETs", *IEEE Device Research Conference, Conference Digest. 58th DRC,* (Jun. 19–21, 2000), 67–68.

Yang, D., et al., "Intrinsic Gettering in Nitrogen Doped Czochralski Crystal Silicon", *High Purity Silicon VI. Proceedings of the Sixth International Symposium (Electrochemical Society Proceedings vol. 2000–17) (SPIE vol. 4218),* (2000),357–61.

Yang, Deren, et al., "Nitrogen in Czochralski Silicon", *2001 6th International Conference on Solid–State and Integrated Circuit Technology. Proceedings, 1(1),* (2001),255–60.

Yin, Haizhou, "High Ge–Content Relaxed Sil–xGex Layers by Relaxation on Complaint Substrate with Controlled Oxidation", *Electronic Materials Conference, Santa Barbara, Jun. 2002,*(Jun. 2002),8.

Zhu, Z H., et al., "Wafer bonding and its application on compliant universal (CU) substrates", *Conference Proceedings, 10th Annual Meeting IEEE Lasers and Electro–Optics Society,* (Nov. 10–13, 1996),31.

Zhu, Z H., et al., "Wafer bonding technology and its applications in optoelectronic devices and materials", *IEEE Journal of Selected Topics in Quantum Electronics,* (Jun. 1997), 927–936.

\* cited by examiner

THREE-DIMENSIONAL PHOTONIC CRYSTAL WAVEGUIDE STRUCTURE AND METHOD

CROSS-REFERENCE TO RELATED APPLICATIONS

This patent application is related to U.S. patent application Ser. No. 09/861,770 filed on May 22, 2001, and entitled "Method of forming three-dimensional photonic band structures in solid materials,", now issued as U.S. Pat. No. 6,582,512, which is incorporated herein by reference. This patent application is also related to U.S. patent application Ser. No. 10/053,003, filed on Jan. 17, 2002, and entitled "Three-dimensional complete bandgap photonic crystal formed by crystal modification," which is incorporated herein by reference.

FIELD OF THE INVENTION

The present invention pertains to waveguides, and in particular to waveguide structures and methods employing photonic crystals.

BACKGROUND OF THE INVENTION

The wave nature of electrons and the periodic lattice of atoms give rise to allowed energy bands and forbidden energy gaps for electrons in a solid. The forbidden gaps arise from the destructive interference of electrons for certain wavelengths and directions. If a forbidden gap exists for all possible directions, it is referred to as a complete bandgap. A semiconductor has a complete bandgap between the valence and conduction bands.

The optical analogy is the photonic crystal, where a periodic lattice of contrasting dielectric structures (i.e., different indices of refraction) provides the periodic potential for light that atoms do for electrons. Photonic crystals can be thought of as extensions of diffraction gratings (i.e., a one-dimensional photonic crystal) or naturally occurring crystals used in X-ray crystallography. Light interacting with a diffraction grating or X-ray crystal interacts with the periodic structure and is redistributed into "allowed" and precluded from "forbidden" directions. The forbidden directions are the "photonic bandgaps" of the structure.

Photonic crystals can be designed with photonic bandgaps that prevent light of a certain wavelength and direction from propagating within the photonic crystal. If the photonic crystal does not allow light to propagate within a wavelength range for all polarizations and directions, it is said to have a "complete photonic bandgap." A necessary condition for a complete photonic bandgap is that the contrasting dielectric lattice be periodic in three dimensions (3D).

Research of photonic crystals and their behavior was prompted by the article by Yablonovitch, entitled "Inhibited spontaneous emission in solid-state physics and electronics," in *Phys. Rev. Lett.* 58, No. 20, 2059–2062 (1987). Based on theoretical considerations, a number of new optical devices, from better lasers to extremely miniaturized light switches and guides, have been suggested by workers in this relatively new field.

While photonic crystals offer a great deal of promise in fabricating new devices, fabricating such crystals with predetermined structures is daunting. The article by Yablonovitch et al., entitled "Photonic band structure: the face-centered-cubic case employing nonspherical atoms," in *Phys. Rev. Lett.* 67, No. 17, 2295–2298 (1991), describes the formation of the first artificial 3D photonic crystal by drilling an array of intersecting millimeter size holes in a dielectric material. This photonic crystal has a bandgap in the microwave range of the spectrum and is of limited practical interest.

Since the early pioneering work by Yablonovitch, a great deal of research has been devoted to the fabrication and study of photonic crystals in the infrared and visible. The article by Birner et al., entitled "Silicon-based photonic crystals," in *Adv. Mater.* 13, No. 6, Mar. 16, 2001, describes fabricating two-dimensional (2D) and 3D photonic crystals. 2D photonic crystals have periodicity in two dimensions and are uniform in the third dimension and are much easier to fabricate than 3D photonic crystals. Although a 2D photonic crystal can not have a complete bandgap in the strictest sense, it can have a forbidden gap that exists for all directions and polarizations of propagation precisely confined to the plane of periodicity. In this more limited sense, the forbidden gap is referred to as a "complete 2D bandgap."

One application for a 3D photonic crystal having a complete bandgap is to guide light. This can be accomplished by carving a path into such a photonic crystal to serve as an air-filled waveguide. Light that propagates in the air-filled waveguide at a frequency within the complete bandgap will be totally reflected by the photonic crystal and be totally confined to and directed along the waveguide. It should confine light around tight bends much better than conventional waveguides (e.g., optical fibers), where the guiding depends on the limited angular range of total internal reflection at the interface between the higher index core and the lower index cladding.

Much work has been done in the area of 2D photonic crystals. For example, the formation of a two-dimensional array of very small cylindrical holes with a diameter of about 1 micron fabricated in a silicon substrate by electrochemical etching is describe in the article by Birner et al., entitled "Microporous silicon: A two-dimensional photonic bandgap material suitable for the near-infrared spectral range," *Phys. Status Solids*, A 165, 111 (1998). As described in the article by Johnson et al., entitled "Guided modes in photonic crystal slabs," Phys. Rev. B, 60 5751 (1999), this technique has been further developed to form a triangular lattice of 0.36 micron holes on a 0.5 micron pitch to produce a 2D photonic crystal with a "complete 2D bandgap" at a free space wavelength of 1.25 micron.

The article by Loncar et al., entitled "Waveguiding in planar photonic crystals," *Appl. Phys. Lett.*, Vol. 77, No. 13, Sep. 25, 2000, pp. 2813–2815, describes the fabrication of a 2D photonic crystal circuits designed and fabricated in silicon on silicon dioxide. The circuits include a planar waveguide that guides at 1.5 micron and utilizes a 2D photonic crystal consisting of a triangular lattice of cylindrical holes formed by chemically assisted ion-beam etching in silicon, as shown in FIG. 2 of the article. A silicon slab waveguide is formed by omitting one row of cylindrical holes from the 2D photonic crystal. The top and bottom surfaces of the slab waveguide and the photonic crystal are in contact with air. The structure utilizes 2D lateral confinement by the 2D photonic crystal, while confinement in the vertical (i.e., third dimension) is from conventional total internal reflection at the top and bottom Si/air interface. The article discusses propagation in straight sections and around 60° and 90° bends.

While 2D photonic crystal waveguides are useful for certain applications such as planar circuits and distributed feedback (DFB) lasers, there are a host of other applications (e.g., the formation of ultra-small optical and electro-optical integrated circuits and devices) that call for 3D photonic crystal waveguides. To date, however, readily forming 3D photonic crystals waveguides has proven difficult. This is particularly true where the desired bandgap wavelength is at the optical or infrared, since the dimensions of the lattice must be a fraction of the bandgap wavelength.

While some techniques have been developed for fabricating 3D photonic crystals, they involve extreme process conditions, such as forming individual dielectric layers and then stacking and bonding the layers to build the crystal. The formation of 3D waveguides in such crystals adds yet another level of complexity.

Accordingly, there is a need for an improved method of forming waveguides and waveguide-based devices from 3D photonic bandgap crystals.

SUMMARY OF THE INVENTION

A method of forming a three-dimensional (3D) photonic crystal waveguide structure is shown, wherein the method includes forming in respective first and second substrates first and second 3D photonic crystal regions comprising a first and second periodic substantially identical arrays of voids that each form a complete bandgap. A channel is formed in at least one of the first and second 3D photonic crystal regions. The first and second photonic regions are then interfaced to form a 3D waveguide defined by the channel and a portion of the first or second 3D photonic crystal region that covers the channel. The periodic arrays of voids may be formed using surface transformation. Further, if the periodic array of voids is one that normally does not result in a complete bandgap, then the method may involve adding voids to the existing structure to create a modified structure having a complete bandgap.

In addition to the above, method, a waveguide structure formed in a 3D photonic crystal is shown. The waveguide structure includes a 3D photonic crystal comprising a periodic array of voids formed in a solid substrate so as to have a complete photonic bandgap. The voids can be any one of a number of shapes, including spherical. Further, the array of voids can be made up of any one of a number of unit cells, with the lattice constant of the cell selected to be a fraction of the wavelength associated with a desired complete photonic bandgap. A channel waveguide is formed in the 3D photonic crystal and is sized to transmit light of a wavelength corresponding to the complete photonic bandgap.

Further, a waveguide optical system that includes the waveguide structure described briefly above is shown. The 3D photonic crystal includes a periodic array of voids formed in a solid substrate. The periodic array is designed to form a complete photonic bandgap. A channel waveguide is formed in the 3D photonic crystal and is sized to transmit light of a wavelength corresponding to the complete photonic bandgap. A radiation source is operatively coupled to an input end of the channel waveguide to provide radiation to be transmitted down the waveguide. The waveguide optical system may further include a photodetector at an output end of the channel waveguide to receive and detect radiation that has traveled down the channel waveguide and that exits the output end of the channel waveguide. The photodetector produces an electronic signal that may be received by an electronic device and processed.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

In the Figures, the first digit of the reference number corresponds to the Figure number. Accordingly, like elements in different Figures have reference numbers that differ only in the first digit that identifies the Figure number.

DETAILED DESCRIPTION OF THE PREFERRED EMBODIMENTS

In the following detailed description of the embodiments of the invention, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

The term "substrate" as used in the following description includes any material, structure or combination of material/structure for which its optical, electronic, and acoustic properties, among others, can be modified by the formation or rearrangement of photonic energy bands in such material, structure, or combination thereof. Thus, the term "substrate" is understood as including, for example, linear and non-linear optical materials, metals, semiconductors and insulators/dielectrics, acoustic materials, magnetic materials, ferroelectric materials, piezoelectric materials, and superconducting materials, among others. In addition, the term "substrate" is understood as including substrates formed on silicon, silicon-on-insulator, doped and undoped semiconductors, epitaxial layers of silicon supported by a base semiconductor foundation, and other semiconductor structures. Further, when reference is made to a semiconductor "substrate" in the following description, previous process steps may have been utilized to form regions or junctions in the base semiconductor structure or foundation.

Forming a 3D Photonic Crystal With Complete Bandgap

The present invention involves the formation of a complete bandgap 3D photonic crystal to create a fully confined 3D photonic bandgap waveguide structure. The complete bandgap 3D photonic crystal used to fabricate the waveguide structure is formed from a periodic array of voids created in a solid substrate. A preferred technique for creating such voids is called "surface transformation of empty spaces" (or "surface transformation," for short), which is described in detail in U.S. patent application Ser. No. 09/861,770, filed on May 22, 2001, and entitled "Method of forming three-dimensional photonic band structures in solid materials," which Patent Application, as mentioned above, is incorporated herein by reference.

Figure 1:
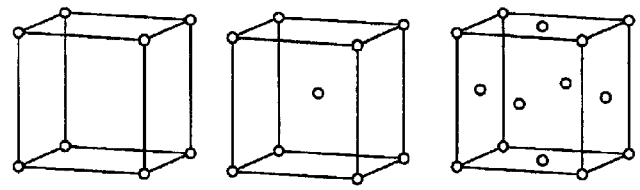
FIG. 1 illustrates fourteen representative unit cells with voids as "atoms," as examples of unit cells that can be used as a basis for forming the complete bandgap 3D photonic crystal waveguide structure of the present invention.
Figure 1:
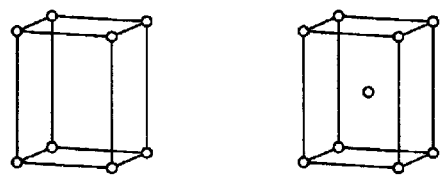
Figure 1:
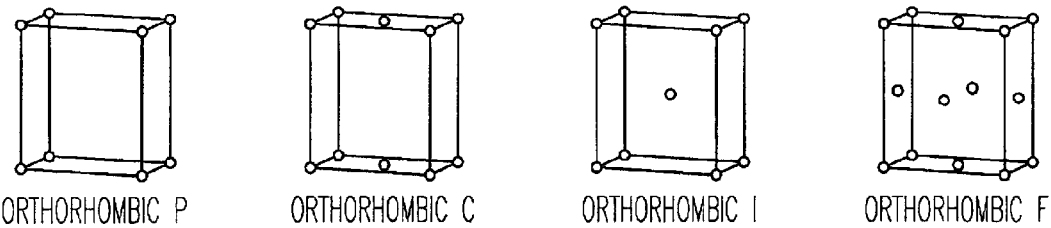
Figure 1:
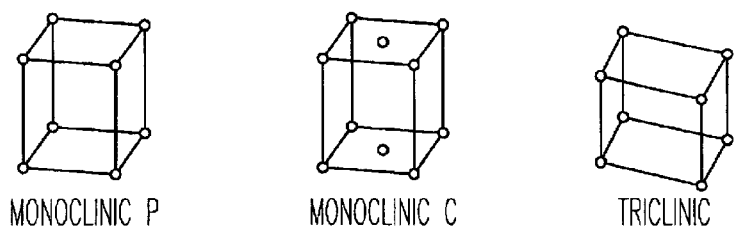
Figure 1:
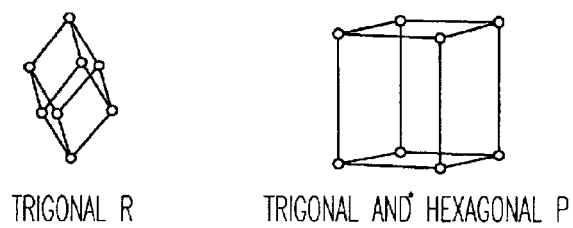

Using the surface transformation technique, a 3D photonic crystal of any lattice symmetry can be fabricated. Any one of a number of space group symmetries can be formed in a substrate of virtually any solid material by surface transformation, to control its optical and electromagnetic properties. The space group symmetries include a plurality of voids formed in the substrate by drilling holes to a predefined depth and at a predefined lattice position, and then heating the material at a temperature close to the melting point of the substrate material, to spontaneously form void patterns at the desired lattice position. The voids may have various geometries (e.g., spherical, cylindrical, plate-like, etc.) and may be formed at different periodicities and in a variety of space group symmetries using, for example, the representative unit cells of FIG. 1, which are described by C. Kittel in *Introduction to Solid State Physics*, J. Wiley & Sons, 3d Ed., (1966).

As a general rule, the wavelength of the photonic bandgap is about twice the period (i.e., lattice constant $a_0$) of the photonic crystal. Thus, to achieve a bandgap for a desired wavelength (e.g., x-ray, ultraviolet, visible, infrared, microwave, etc.), the lattice constant $a_0$ should be a fraction of the desired wavelength. The wavelength and width of the photonic bandgap also depend on the filling ratio, which is the ratio of the volume of the voids in the unit cell to the total volume of the unit cell.

According to the teaching of the present invention, by properly selecting the lattice constant $a_0$ and the "atom" (i.e., void) shape and size, a variety of 3D photonic crystals and thus 3D photonic crystal waveguide structures can be produced for the wavelength region of interest. The lower bound of the photonic bandgap wavelength is determined mainly by the smallest lattice constant $a_0$ and voids that can be formed in the particular substrate.

Waveguide Structure With Modified 3D Photonic Crystal

As mentioned above, the 3D photonic crystal waveguide structure of the present invention requires the formation of a complete bandgap 3D photonic crystal. However, certain 3D photonic crystals formed with certain space group symmetries and voids of a given size and/or shape may not provide the necessary complete photonic bandgap at one filling ratio but may do so at another. Thus, the present invention includes a method of forming a waveguide structure using a 3D photonic crystal modified to form a complete bandgap. A technique for forming a modified 3D photonic crystal structure is described in U.S. patent application Ser. No. 10/053,003, filed on Jan. 17, 2002 and entitled "Three-dimensional complete photonic bandgap crystal formed by crystal modification," which is incorporated by reference herein.

Ho et al., in their article entitled "Existence of a photonic gap in periodic dielectric structures," *Phys. Rev. Lett.*, Vol. 65, No. 25, Dec. 17, 1990, pp. 3152–3155, which article is incorporated by reference herein, have calculated the photonic band structure of the diamond lattice for air spheres (i.e., spherical voids) of various sizes in a dielectric background. Ho et al. have identified the conditions under which a complete bandgap exists for a diamond lattice of spherical voids.

Figure 2:
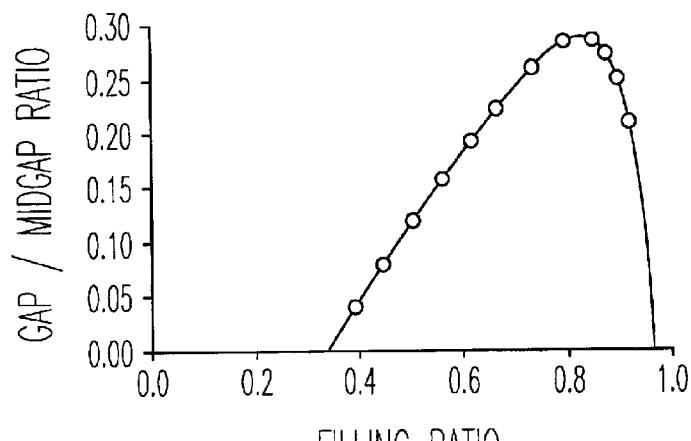
FIG. 2 is a plot taken from the article by Ho et al. that graphs the gap/mid-gap ratio as a function of the filling ratio for a diamond crystal structure comprising air spheres formed in a solid dielectric substrate.
Figure 3A:
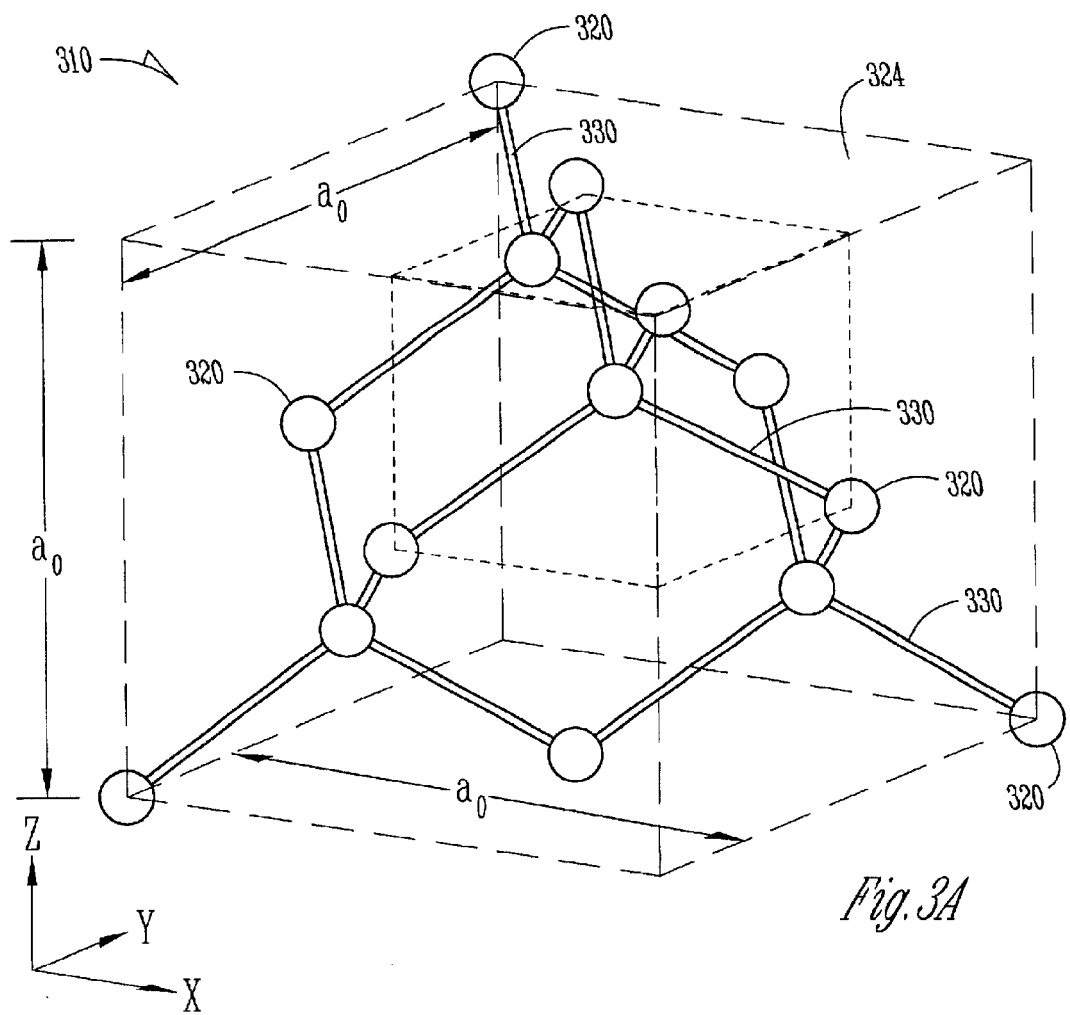
FIG. 3A illustrates a diamond unit cell formed from spherical void "atoms" created in a solid substrate, where the "atoms" are linked by imaginary tetrahedral "bonds"

FIG. 2 is adapted from the article by Ho (FIG. 3(a) therein), and plots the "gap/mid-gap ratio" versus the filling ratio for air spheres formed in a solid substrate. The gap/mid-gap ratio is the ratio of the size of the calculated bandgap (in units of frequency) of the diamond crystal normalized to the mid-gap frequency. From FIG. 2, it can be seen that a filling ratio of about 0.35 or greater is required to achieve a complete bandgap. Further, the gap/mid-gap ratio grows until a filling ratio of about 0.8 is reached, at which point the gap/mid-gap ratio decreases rapidly.

Figure 3B:
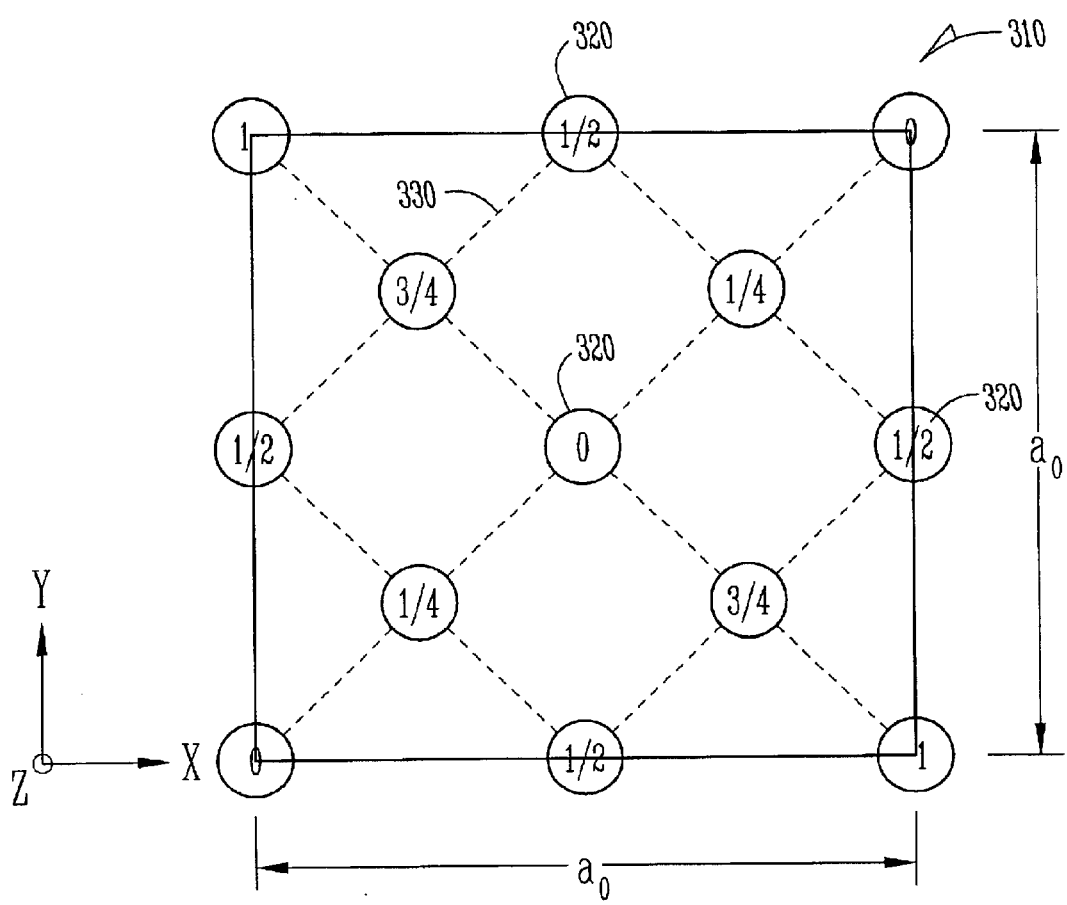
FIG. 3B is a diagram representing the spherical void positions in the diamond unit cell of FIG. 3A as projected on a cube face, with the fractions denoting the height above the base in lattice constant ($a_0$) units.

FIGS. 3A and 3B illustrate a 3D photonic diamond lattice crystal 310 of spherical voids 320 with a lattice constant $a_0$ formed in a substrate 324. Spherical voids 320 are connected by imaginary tetrahedral "bonds" 330. It is assumed below for the sake of illustration that substrate 324 is silicon (optical index, n=3.6), with the x and y axes in the plane of the substrate and the z-axis normal to the substrate plane. It is further assumed, as an example embodiment, that spherical voids 320 are formed by surface transformation.

Figure 4:
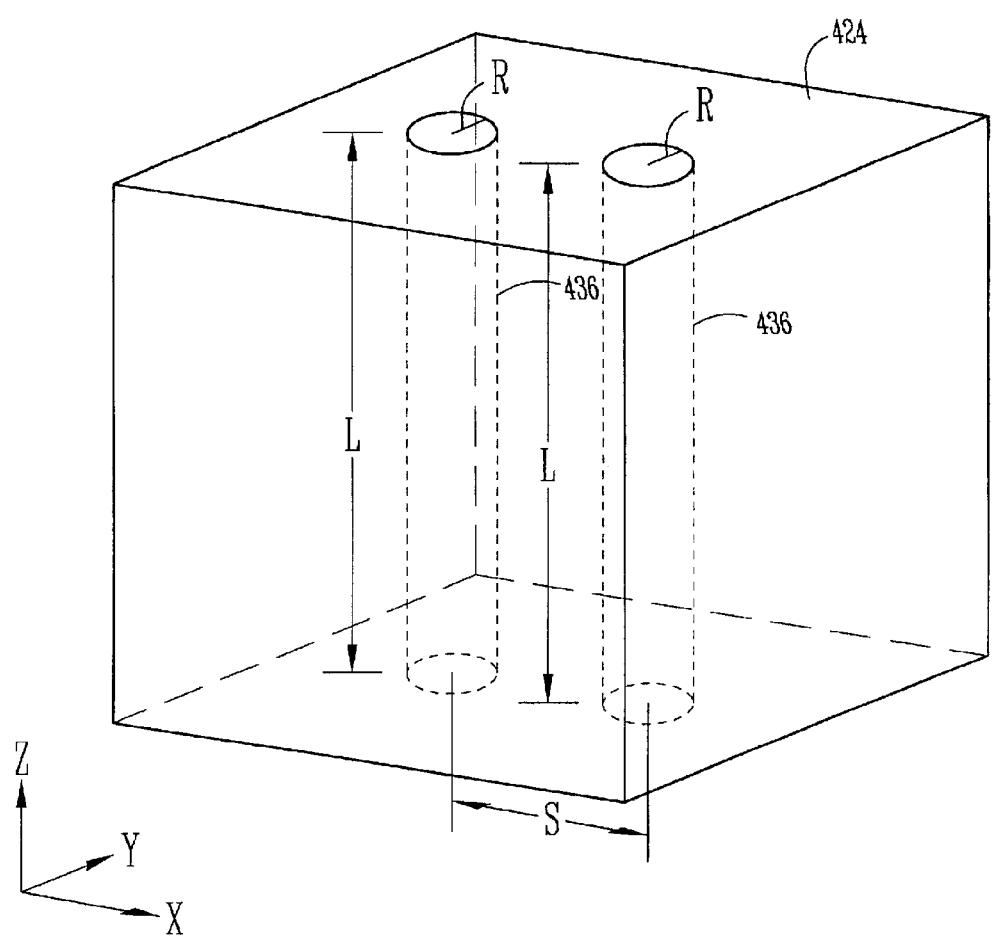
FIG. 4 is a top-down perspective view of a substrate having formed therein cylindrical holes of a select length L, radius R and spacing S prior to forming spherical voids via surface transformation.

As illustrated in FIG. 4, surface transformation involves drilling into substrate 424 a defined set of cylindrical holes 436 having a specific radius R, depth L and separation S (e.g., equal to lattice constant $a_0$), and then annealing the substrate. It will be understood that the method described below can be applied to forming complete photonic bandgaps in other high index (n>2) substrates such as GaAs, InP, etc., by modifying the annealing conditions.

For simplicity, the formation of one unit cell in (x,y) and N unit cells in the Z-direction is described. To form additional unit cells in the (x,y) plane, repeated translation of the hole pattern, modulo $a_0$, in the x and y directions is all that is required.

To create spherical voids with a lattice periodicity $a_0$ in the z-direction into the substrate requires that the radius of the cylindrical holes must be:

$$R=a_0/8.89 \sim 0.11\, a_0.$$

After surface transformation, the radius $R_s$ of each spherical void 20 is:

$$R_s=(1.88/8.99)a_0 \sim 0.212\, a_0$$

The depth L of the initial cylindrical holes required to form by surface transformation each unit cell and the spherical void lattice sites at (x,y,z) for the N unit cells in the z-direction are:

(a) For unit cell sites (1,0,1) and (0,1,1):

$$L_1=(N)\, a_0=(N)\, 8.89\, R$$

(b) For (¾,¼,¾) and (¼,¾,¾):

$$L_{3/4}=(N+¼)\, a_0$$

(c) For (½,0,½), (0,½,½), (1,½,½) and (½,1,½)

$$L_{1/2}=(N+½)\, a_0$$

The two lattice points (1,½,½) and (½,1,½) are actually in the next adjacent x-translated and y-translated unit cells, respectively. They are given to be consistent with FIGS. 3A and 3B, but are omitted when translating the unit cell in the x and y direction modulo $a_0$.

(d) For (¼,¼,¼) and (¾,¾,¼):

$$L_{1/4}=(N+¾)\, a_0$$

(e) For (0,0,0), (½,½,0) and (1,1,0):

$$L_0=(N+1)\, a_0$$

During annealing (e.g., at 1100° C. in a 10 torr atmosphere of hydrogen), spherical voids 320 form in silicon substrate 324 at each of the lattice sites in the vertically stacked N unit cells of diamond lattice 310, as depicted in FIG. 3A.

Since the nearest neighbors in diamond lattice 310 are 0.433 $a_0$ distant along the directions of tetrahedral bonds 330 and the spherical void radius $R_s$ is 0.21 $a_0$, the surface transformation formed diamond lattice has a filling ratio of only 0.32.

With reference again to the plot of FIG. 2, it can be seen that the filling ratio of 0.32 is not sufficient to produce a complete bandgap (i.e., at a filling ratio of 0.32, the gap size is zero). However, if the fill ratio can be increased to about 0.35 or greater, then a complete bandgap can be achieved.

Figure 5A:
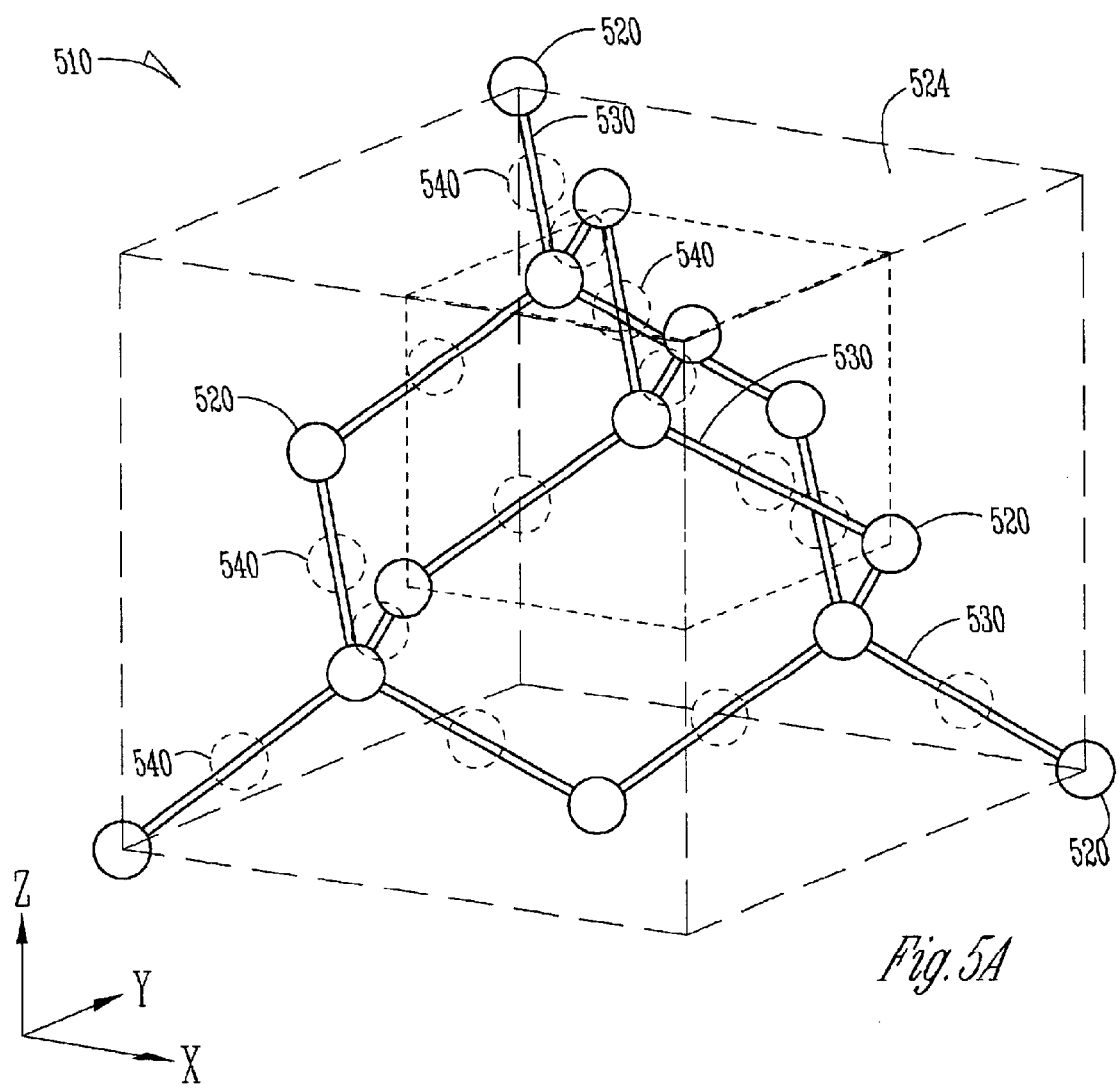
FIG. 5A illustrates a modified diamond unit cell formed by modifying the diamond unit cell of FIG. 3A by forming additional spherical voids halfway between the existing spherical voids along the tetrahedral bonds.
Figure 5B:
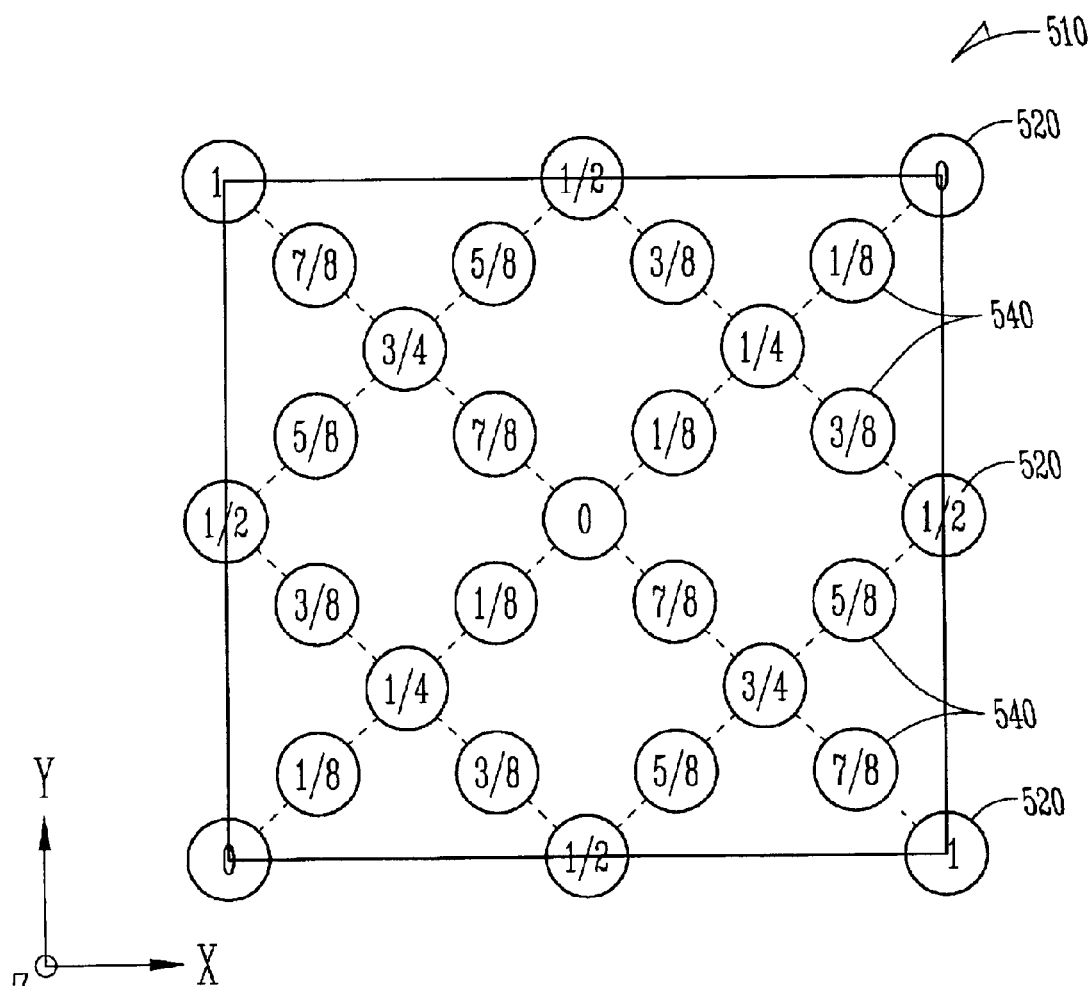
FIG. 5B is the same plot as FIG. 3B, but for the modified diamond unit cell of FIG. 5A.

With reference now to FIGS. 5A and 5B, the diamond crystal 310 of FIG. 3A is modified to include additional spherical voids 540 of radius 0.212$a_0$ at a point halfway along each of tetrahedral bond 530. Spherical voids 540 do not alter the diamond symmetry, yet they increase the filling ratio to 0.48, resulting in a complete bandgap with a gap/mid-gap ratio of about 0.1. The crystal 510 shown in FIGS. 5A and 5B is referred to herein as a "modified diamond crystal."

The depth L of the initial cylindrical hole required to form by surface transformation spherical voids 520 and 540 at each unit cell lattice location at (x,y,z) for the N modified unit cells in the z-direction are:

(A) For lattice sites (1,0,1) and (0,1,1)

$$L_1=(Npk)\, a_0$$

(B) For (⅞,⅛,⅞), (⅝,⅜,⅞), (⅜,⅝,⅞) and (⅛,⅞,⅞)

$$L_{7/8}=(N+⅛)a_0$$

(C) For (¾,¼,¾) and (¼,¾,¾)

$$L_{3/4}=(N+¼)a_0$$

(D) For (⅝,⅛,⅝), (⅞,⅜,⅝), (⅛,⅝,⅝) and (⅜,⅞,⅝)

$$L_{5/8}=(N+⅜)a_0$$

(E) For (½,0,½), (0,½,½), (1,½,½), and (½,1,½)

$$L_{1/2}=(N+½)a_0$$

As before, lattice sites (1,½,½) and (½,1,½) are actually in the next unit adjacent x-translated and y-translated unit cells respectively. They are given to be consistent with FIGS. 5A and 5B but need to be omitted when translating the unit cell in the x and y direction modulo $a_0$.

(F) For (⅜,⅛,⅜), (⅛,⅜,⅜), (⅞,⅝,⅜) and (⅝,⅞,⅜)

$$L_{3/8}=(N+⅝)a_0$$

(G) For (¼,¼,¼), and (¾,¾,¼)

$$L_{1/4}=(N+¾)a_0$$

(H) For (⅛,⅛,⅛), (⅜,⅜,⅛), (⅝,⅝,⅛) and (⅞,⅞,⅛)

$$L_{1/8}=(N+⅞)a_0$$

(I) For (0,0,0), (½,½,0) and (1,1,0)

$$L_0=(N+1)a_0$$

Annealing (e.g., at 1100° C. and in a 10 torr hydrogen atmosphere) substrate 524 with the above-defined pattern of cylindrical holes produces spherical voids 520 at the apexes of the tetrahedral bonds 530 and spherical voids 540 halfway between spherical voids 520 along the tetrahedral bonds 530 in the vertically stacked N unit cells of the modified diamond lattice, as depicted in FIGS. 5A and 5B.

The annealing time required to form N (z-stacked) unit cells can be estimated using, for example, the approach described in the paper by Matsutake and Ushiku, presented in the Extended Abstracts of the "2000 International Conference on Solid State Devices and Materials," Tokyo, Japan, pp. 198–199 (2000). For $a_0 \sim 1$ micron and hence $R \sim 0.1$ micron, the annealing time (in seconds) for formation of N (z-stacked) unit cells is estimated to be $\sim N \times 40$.

Although the formation of a complete bandgap 3D crystal lattice from incomplete bandgap crystal lattice has been described in connection with modifying a diamond lattice of spherical voids formed in a silicon substrate, the method applies generally to modifying any incomplete bandgap crystal lattice. The method described in article by Ho et al. can be employed to determine whether a particular crystal structure will have a complete bandgap and if not, if the crystal structure can be modified to produce a complete bandgap. Alternatively, whether a particular crystal structure will yield a complete bandgap, or whether a particular crystal structure can be modified to achieve a complete bandgap can be determined empirically.

3D Photonic Crystal Waveguide Formation

Methods of forming a fully confined 3D photonic bandgap waveguide structure are now described with reference to FIGS. 6A through 6G.

Figure 6A:
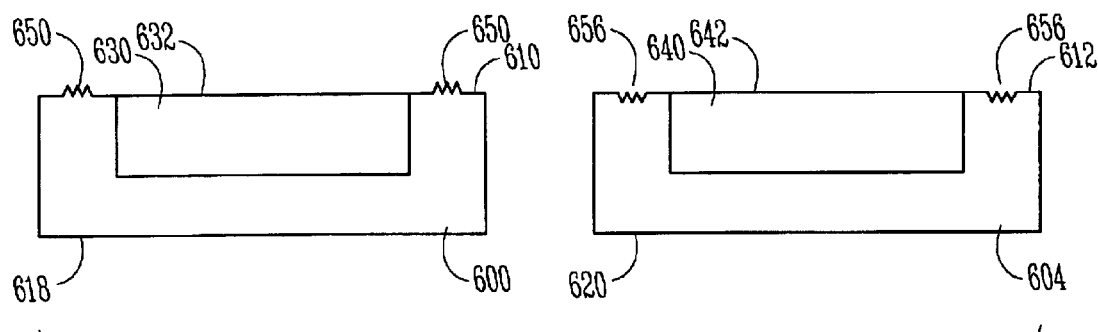
FIG. 6A is a cross-sectional view of first and second substrates each having formed therein substantially identical 3D photonic crystal regions.

In FIG. 6A, first and second substrates 600 and 604 with respective top surfaces 610 and 612 and respective bottom surfaces 618 and 620 are provided. A first 3D photonic crystal region 630 with an upper surface 632 and a complete bandgap is formed in first substrate 600 to a depth of at least 10 to 15 lattice constants $a_0$ and a width of at least 20 to 30 lattice constants. A second 3D photonic crystal region 640 with an upper surface 642 and a complete bandgap is formed in second substrate 604 Second 3D photonic crystal region 640 is preferably identical (or substantially identical, to within about 0.1 $a_0$) to first 3D photonic crystal region 630.

In an example embodiment, first and second 3D photonic crystal regions 630 and 640 are formed by surface transformation. Further in an example embodiment, first and second 3D photonic crystal regions are formed to have modified crystal structures with complete bandgaps, as discussed above in connection with the example of a modified diamond crystal structure. Generally, first and second 3D photonic crystal regions can have any arrangement of voids that provides a complete bandgap.

In an example embodiment, top surface 610 of substrate 600 includes alignment marks 650 adjacent first 3D photonic crystal region 630, and top surface 612 of substrate 604 includes alignment marks 656 adjacent second 3D photonic crystal region 640. Alignment marks 650 and 656 are designed to facilitate the mutual alignment of 3D photonic crystal regions 630 and 640, as described below.

Figure 6B:
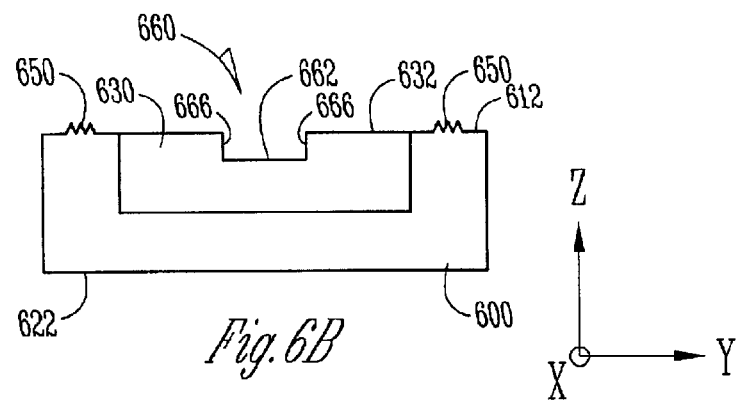
FIG. 6B is a cross-sectional view of the first substrate of FIG. 6A, with a channel formed in the surface of the 3D photonic crystal region.
Figure 6C:
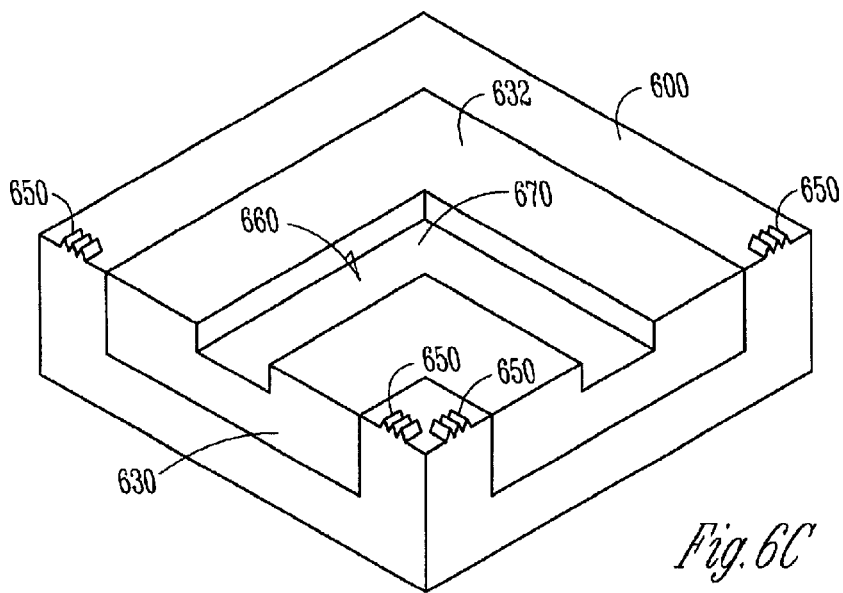
FIG. 6C is a top-down perspective view of the first substrate, with a channel having a bend formed in the 3D photonic crystal region.
Figure 6D:
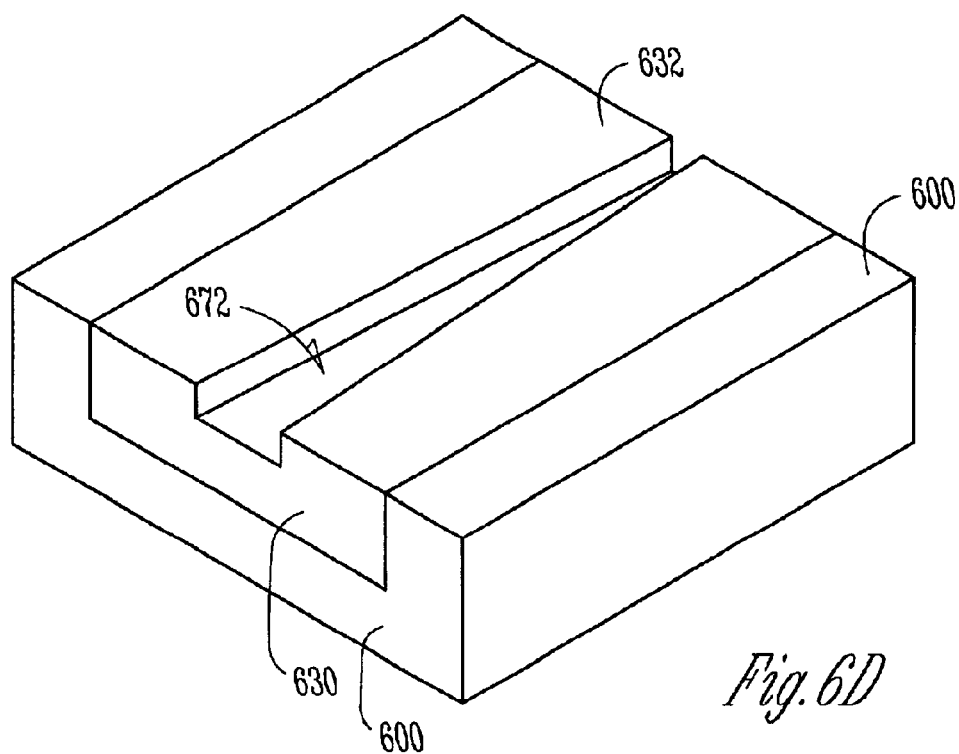
FIG. 6D is a top-down perspective view of the first substrate with a tapered channel formed in the 3D photonic crystal region.

In FIG. 6B, a channel 660 is formed in upper surface 632 of 3D photonic crystal region 630 by removing a number (e.g., 1 to 4) unit cells in the horizontal (Y-direction) and a number (e.g., 1 to 4) unit cells in the vertical (Z-direction). The precise number of unit cells removed depends on the lattice constant and the wavelength of light to be guided. Generally speaking, channel 660 is sized to transmit light of a wavelength corresponding to the complete bandgap of the 3D photonic crystal regions 630 and 640. Any one of a number of standard lithographic techniques, such as etching, can be used to form channel 660. Channel 660 includes a lower wall 662 and opposing sidewalls 666. In an example embodiment, channel 660 has a rectangular cross-section, as shown. In another example embodiment illustrated in FIG. 6C, channel 660 includes a bend 670. Though channel 660 is shown to be rectangular in cross-section, other shapes, including a tapered channel 672 as shown in FIG. 6D, can be formed.

Figure 6E:
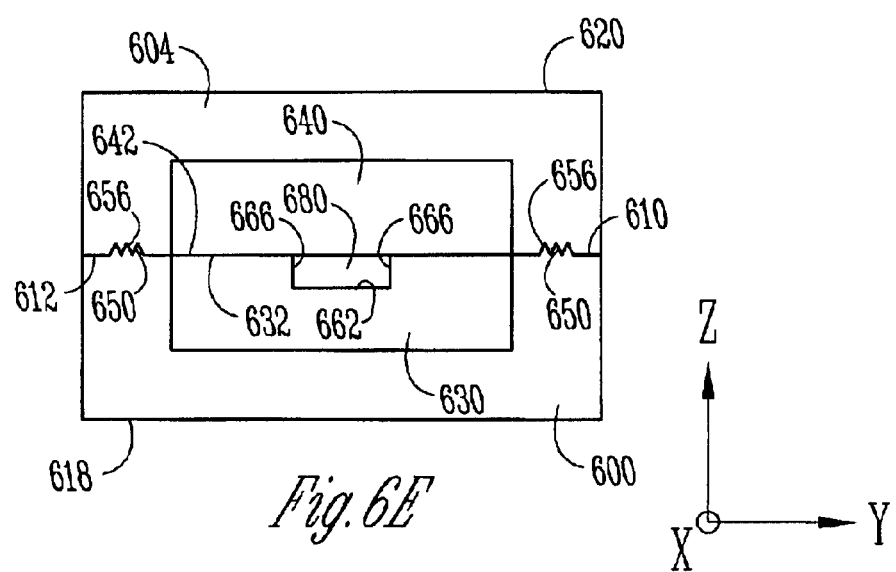
FIG. 6E is a cross-sectional view of the first and second substrates aligned and bonded to one another to form the channel waveguide.

In FIG. 6E, substrates 600 and 604 are placed so that their top surfaces 610 and 612 are confronting. 3D photonic crystal regions 630 and 640 are then aligned with one another (e.g., through the use of alignment marks 650 and 656) and top surfaces 610 and 612 are brought into contact and bonded together using standard substrate bonding techniques. The bonded structure creates, in effect, a single 3D photonic crystal with a 3D channel waveguide 680 defined by lower wall 662, opposing sidewalls 666 of channel 660, and the portion of upper surface 642 of second 3D photonic crystal region 640 covering the channel.

Figure 6F:
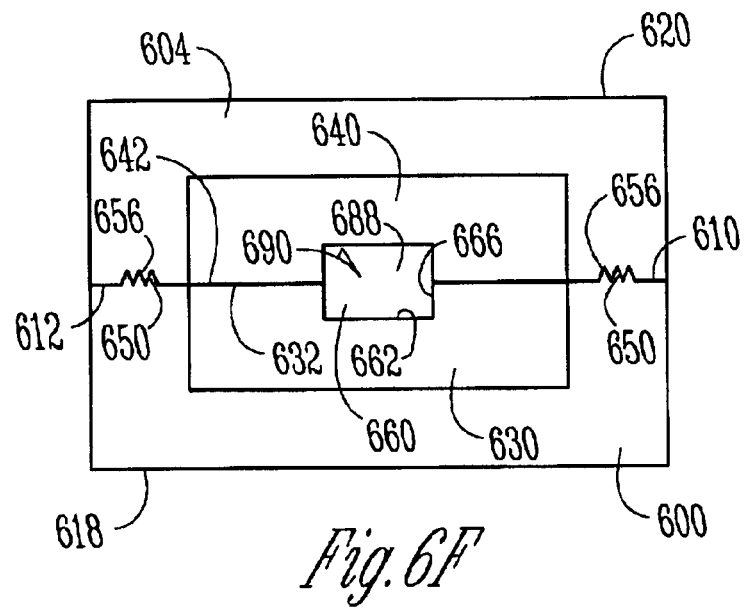
FIG. 6F is a cross-sectional diagram similar to FIG. 6E, but wherein the second 3D photonic crystal region also has a channel.

In FIG. 6F, an alternative example embodiment is illustrated wherein a rectangular channel 688 having the same width as channel 660 is formed in region 640, so that a channel waveguide 690 is formed from the channels in each of 3D photonic crystal regions 630 and 640.

Figure 6G:
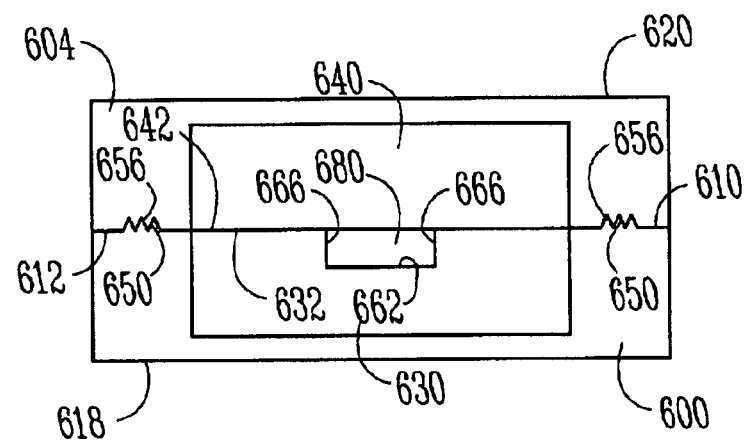
FIG. 6G is a cross-sectional view of the bonded substrates of FIG. 6E, with the bottom surface of the second (top) substrate polished down to at or just above the 3D photonic crystal region of the second substrate.

In FIG. 6G, bottom surface 620 of substrate 604 and/or bottom surface 618 of substrate 600 is/are optionally polished down close to 3D photonic crystal region 640 and/or 3D photonic crystal region 630. In some cases, it might be desirable to polish to the top of one or both of 3D photonic crystal regions 640 and 630, or even into one or both of the 3D photonic crystal regions down to near waveguide 680.
3D Photonic Crystal Waveguide Optical System The present invention includes a 3D photonic crystal waveguide optical system 701 formed using the 3D photonic crystal waveguide described immediately above and shown, for example, in FIGS. 6E and 6G.

Figure 7:
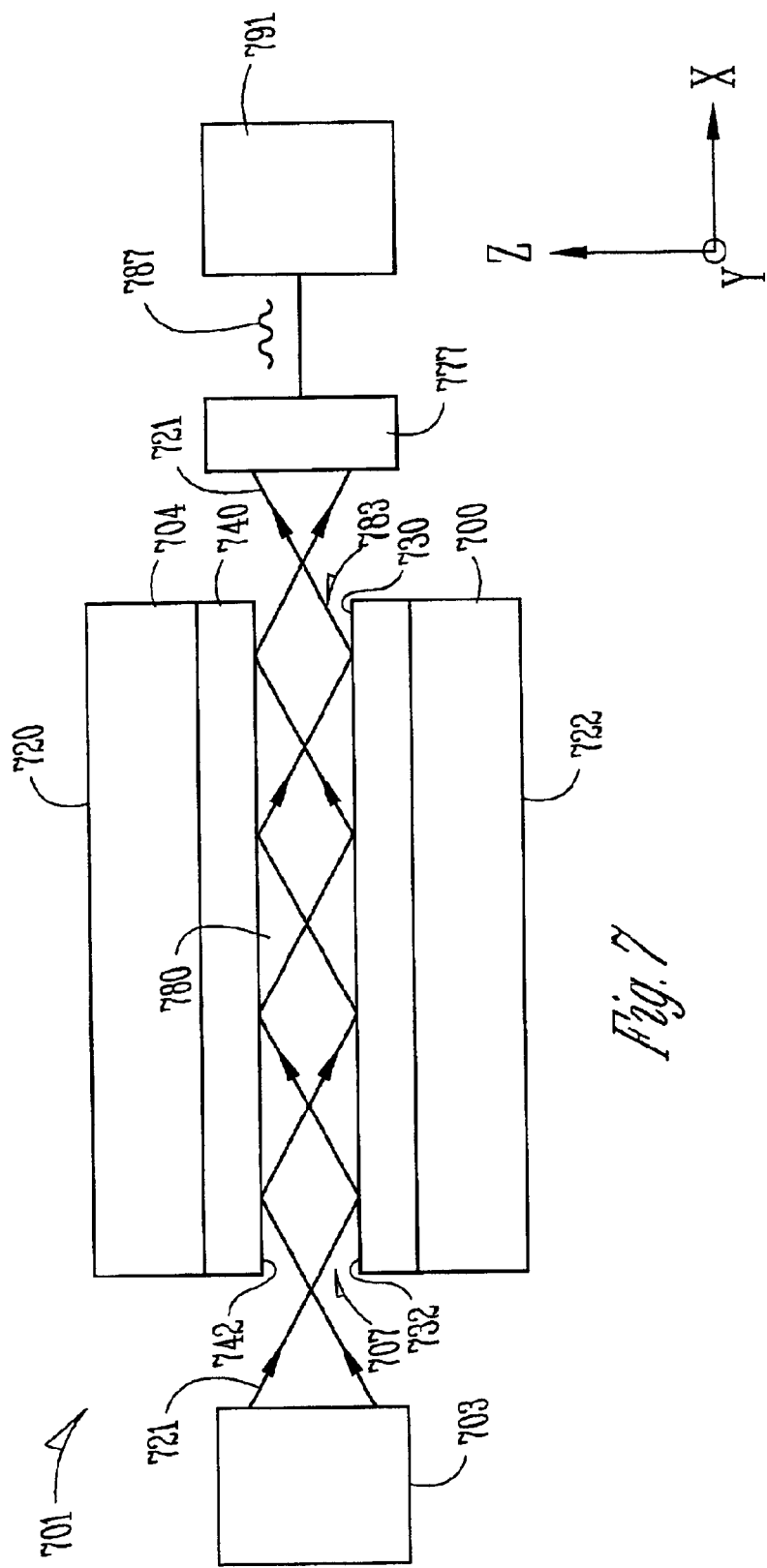
FIG. 7 is a cross-sectional view of a 3D photonic crystal waveguide optical system that includes the 3D photonic crystal waveguide of FIG. 6E.

With reference to FIG. 7, waveguide optical system 701 includes a radiation source 703 operatively coupled to an input end 707 of 3D photonic waveguide 780 so that radiation 721 emitted from the radiation source is transmitted down the waveguide. Radiation 721 has a wavelength within the photonic bandgap of 3D photonic crystal regions 730 and 740 that define waveguide 780. In an example embodiment, radiation source 703 is a laser, such as a diode laser or vertical cavity surface emitting laser (VCSEL).

Radiation 721 is confined in 3D over the entire range of possible propagation angles due to the omnidirectional reflection by each complete bandgap crystal surface e.g., lower channel wall 732, the channel sidewalls (not shown; see 666, FIG. 6G), and upper surface 742 defining waveguide 780. Because waveguide 780 may contain either air, another gas (e.g., nitrogen) or a vacuum, the waveguide is expected to have a transmission loss comparable to or better than today's low loss fibers (0.3 dB per kilometer) used for long-distance optical communication. Also, bending losses from bends (e.g., bend 670, FIG. 6C) should be remarkably low as compared to conventional waveguides because the reflection mechanism of complete bandgap photonic crystals is not sensitive to incident angle. This allows for waveguide 780 to have bends of up to 90 degrees, providing more design latitude in fabricating waveguide-based integrated optical systems such as couplers, Y-junctions, add-drop multiplexers, and the like.

With continuing reference to FIG. 7, a photodetector 777 is operatively coupled to an output end 783 of waveguide 780 to receive and detect radiation 721 having traveled down the waveguide, and to generate an electrical signal (i.e., a photocurrent) 787 in response thereto. Connected to photodetector 777 is an electronic system 791 operable to receive and process electrical signal 787.

CONCLUSION

The present invention is a 3D photonic crystal waveguide structure and methods of forming same. The 3D photonic crystal used in the present invention comprises a periodic array of voids, which in an example embodiment, are formed using the surface transformation technique. Further, in forming the waveguide structure, two 3D photonic crystal regions are interfaced and bonded to form a single 3D photonic crystal. This allows for the waveguide structure to be readily fabricated by forming a channel in at least one of the 3D photonic crystal regions.

The methods of the present invention also allows for a wide variety of different 3D photonic crystal waveguides to be formed, with complete bandgaps at wavelengths ranging from the very small (e.g., ultraviolet and below) to the relatively large (infrared and above). Further, the present invention provides for utilizing a 3D photonic crystal structure modified to have a complete bandgap to form the 3D waveguide structure.

While the present invention has been described in connection with preferred embodiments, it will be understood that it is not so limited. On the contrary, it is intended to cover all alternatives, modifications and equivalents as may be included within the spirit and scope of the invention as defined in the appended claims.

What is claimed is:

1. A method of forming a three-dimensional (3D) photonic crystal waveguide structure, comprising:

forming in first and second substrates respective first and second 3D photonic crystal regions respectively comprising first and second substantially identical periodic arrays of voids defining substantially identical first and second complete bandgaps;

forming a first empty channel in the first 3D photonic crystal region; and interfacing the first and second 3D photonic crystal regions to form a 3D waveguide defined by the first empty channel and a portion of the second 3D photonic crystal region covering the first empty channel.

2. The method of claim 1, wherein the method includes forming the first and second periodic arrays of voids via surface transformation.

3. The method of claim 1, wherein the method includes:

determining a filling ratio of voids needed to produce the first and second complete bandgaps; and forming voids in the first and second substrates to achieve the determined filling ratio.

4. The method of claim 3, wherein the method includes forming the first and second periodic array of voids from unit cells connected by imaginary bonds, and forming second voids along the imaginary bonds.

5. The method of claim 4, wherein the method includes forming the first and second voids as spherical voids.

6. The method of claim 1, wherein the method includes forming a second empty channel in the second 3D photonic crystal region, and aligning the first empty channel with the second empty channel when interfacing the first and second 3D photonic crystals so that the 3-D waveguide is defined by the first and second empty channels.

7. The method of claim 1, wherein the method includes forming the first empty channel to have a rectangular cross-section.

8. A method of forming a 3D photonic crystal waveguide structure, comprising:

combining two 3D photonic crystal regions each formed from a substantially identical periodic array of voids via surface transformation so as to form a complete bandgap in each 3D photonic crystal region; and wherein at least one of the 3D photonic crystal regions includes an empty channel that forms a waveguide upon said combining of the two 3D photonic crystal regions.

9. The method of claim 8, wherein the method includes forming the voids to be spherical voids.

10. The method of claim 9, wherein the method includes arranging the periodic arrays of voids to form a modified diamond crystal structure.

11. The method of claim 8, wherein the method includes forming the empty channel to include a taper.

12. The method of claim 8, wherein the method includes forming the empty channel to include a bend.

13. The method of claim 8, wherein the method includes forming the periodic array of spherical voids from unit cells, and forming the empty channel be at least one unit cell in width and at least one unit cell in depth.

14. The method of claim 8, wherein the method includes forming the empty channel by etching at least one of the two 3D photonic crystal regions.

15. The method of claim 8, wherein combining the two 3D photonic crystal regions includes aligning alignment marks formed relative to each of the two 3D photonic crystal regions.

16. A method of guiding radiation, comprising:

forming in first and second substrates respective first and second 3D photonic crystal regions respectively including first and second substantially identical periodic arrays of voids defining substantially identical first and second complete bandgaps;

forming a first empty channel in the first 3D photonic crystal region; interfacing the first and second 3D photonic crystal regions to form a 3D waveguide defined by the first empty channel and a portion of the second 3D photonic crystal region covering the first empty channel; and introducing radiation into an input end of the 3D waveguide.

17. The method of claim 16, wherein the method further includes detecting radiation at an output end of the 3D waveguide and generating an electronic signal in response thereto.

18. The method of claim 16, wherein the method further includes processing the electronic signal.

19. The method of claim 16, wherein the method includes forming the first and second periodic arrays of void by surface transformation.

20. A method of guiding radiation, comprising:

combining two 3D photonic crystal regions having formed therein substantially identical periodic arrays of voids via surface transformation so as to form a complete bandgap in each 3D photonic crystal region, wherein at least one of the 3D photonic crystal regions includes an empty channel that forms a waveguide upon said combining of the two 3D photonic crystal regions; and introducing radiation into the waveguide having a wavelength within the complete photonic bandgap.

21. The method of claim 20, wherein the method includes forming the voids to be spherical.

22. The method of claim 20, wherein the method includes forming the two 3D photonic crystal regions to each comprise a modified diamond crystal structure.

23. A method of forming a 3D photonic crystal waveguide, comprising: forming first and second substantially identical 3D photonic crystal regions, wherein at least one of the regions includes an empty channel, and combining the first and second 3D photonic crystal regions to form a single 3D photonic crystal region with a waveguide defined by the empty channel, the single 3D photonic crystal having a complete photonic bandgap defined by first and second periodic arrays of voids formed in each of the first and second 3D photonic crystal regions.

24. The method of claim 23, wherein the method includes forming the first and second periodic arrays of voids by surface transformation.

25. The method of claim 23, wherein the method includes forming the voids as spherical voids.

26. The method of claim 23, including forming the first and second 3D photonic crystal regions with unit cells of first spherical voids having a diamond structure modified with second spherical voids to form the complete bandgap.

27. The method of claim 23, wherein the method includes:

selecting a desired wavelength for the complete photonic bandgap; and forming the periodic array of voids to have a period a fraction of the desired wavelength.

28. The method of claim 27, wherein the desired wavelength is one of x-ray, ultraviolet, visible, infrared, and microwave.

29. The method of claim 23, wherein the first and second 3D photonic crystal regions are formed in respective first and second substrates, and wherein combining the first and second 3D photonic crystal regions includes interfacing and bonding the substrates.

30. A waveguide structure comprising:

first and second 3D photonic crystal regions combined to form a single 3D photonic crystal region having a complete photonic bandgap defined by first and second periodic arrays of voids formed in each of the first and second 3D photonic crystal regions by surface transformation; and an empty channel passing through the single 3D photonic crystal region sized to receive and guide radiation of a wavelength corresponding to the complete photonic bandgap.

31. The waveguide structure of claim 30, wherein the voids are spherical.

32. The waveguide structure of claim 30, wherein the first and second periodic arrays of voids form a modified diamond crystal structure.

33. The waveguide structure of claim 30, wherein the empty channel includes a bend.

34. The waveguide structure of claim 30, wherein the empty channel includes a taper.

35. A waveguide structure, comprising: a 3D photonic crystal including a periodic array of voids formed in a solid substrate so as to have a complete photonic bandgap; and an empty channel waveguide formed in the 3D photonic crystal and sized to transmit light of a wavelength corresponding to the complete photonic bandgap.

36. The waveguide structure of claim 35, wherein the 3D photonic crystal includes first and second interfaced 3D photonic crystal regions formed in first and second substrates.

37. The waveguide structure of claim 35, wherein the voids are spherical.

38. The waveguide structure of claim 35, wherein the periodic array of voids includes a plurality of cells having a modified diamond structure.

39. The waveguide structure of claim 35, wherein the empty channel waveguide has a bend.

40. The waveguide structure of claim 35, wherein the empty channel waveguide has a rectangular cross-section.

41. The waveguide structure of claim 35, wherein the empty channel waveguide includes a taper.

42. The waveguide structure of claim 35, wherein the substrate includes a material selected from the group of materials consisting of a linear optical material, a non-linear optical material, a metal, a semiconductor, an insulator, a dielectric, an acoustic material, a magnetic material, a ferroelectric material, a piezoelectric material, and a superconducting material.

43. The waveguide structure of claim 35, wherein the complete photonic bandgap has a wavelength including one of an x-ray wavelength, an ultraviolet wavelength, a visible wavelength, an infrared wavelength and a microwave wavelength.

44. The waveguide optical system comprising: a 3D photonic crystal comprising a periodic array of voids formed in a solid substrate so as to have a complete photonic bandgap; an empty channel waveguide formed in the 3D photonic crystal and sized to transmit light of a wavelength corresponding to the complete photonic bandgap; and a radiation source operatively coupled to a first end of the empty channel waveguide to provide radiation to be transmitted down the waveguide.

45. The waveguide optical system of claim 44, wherein the radiation source is a laser.

46. The waveguide optical system of claim 44, further including a photodetector operatively coupled to a second end of the empty channel waveguide to detect radiation transmitted down the empty channel waveguide and generate an electrical signal in response thereto.

47. The waveguide optical system of claim 46, further including an electronic system connected to the photodetector operable to receive and process the electronic signal.

48. The waveguide optical system of claim 44, wherein the periodic array of voids is made up of unit cells, and wherein the unit cells are modified to form the complete photonic bandgap.

49. The waveguide optical system of claim 48, wherein the modified unit cells are modified diamond unit cells.

* * * * *

UNITED STATES PATENT AND TRADEMARK OFFICE
CERTIFICATE OF CORRECTION

PATENT NO. : 6,898,362 B2
DATED : May 24, 2005
INVENTOR(S) : Forbes et al.

It is certified that error appears in the above-identified patent and that said Letters Patent is hereby corrected as shown below:

Title page,
Item [56], References Cited, OTHER PUBLICATIONS,
"Johnson, S G., et al.," reference, delete "Condened" and insert -- Condensed --, therefor and delete "5751-9" and insert -- 5751-8 --, therefor.
"Li, Z Y., et al.," reference, delete "443" and insert -- 433 --, therefor.
"Manoharan, V N.," reference, delete "Materails" and insert -- Materials --, therefor.
"Cornell Demonstrates a Universal Substrates" reference, delete "Substrates" and insert -- Substrate --, therefor.
"Chen, Xiangdong, et al.," reference, delete "heterjunction" and insert -- heterojunction --, therefor.
"Fournel, F, et al.," reference, delete "Angels" and insert --Angles --, therefor.
"Gong, S.S., et al.," reference, delete "30(20)" and insert -- 30(2) --, therefor.
"Kalavade, Pranav, et al.," reference, delete "Conferrence" and insert -- Conference --, therefor.
"Li, Y, X., et al.," reference, delete "instrinsic" and insert -- intrinsic --, therefor.
"Lu, D.," reference, delete "Thremal" and insert -- Thermal --, therefor.
"Mumola, P, B., et al.," reference, delete "thining" and insert -- thinning --, therefor.
"O'Neill, A G., et al.," reference, delete "su-micron" and insert -- sub-micron --, therefor.

Column 7,
Line 66, delete "$L_1=(Npk)\ \alpha_o$" and insert -- $L_1=(N)\ a_0$ --, therefor.

Column 11,
Line 33, delete "3-D" and insert -- 3D --, therefor.

Column 12,
Line 44, after "channel" delete "," and insert -- ; --, therefor.

UNITED STATES PATENT AND TRADEMARK OFFICE
CERTIFICATE OF CORRECTION

PATENT NO. : 6,898,362 B2
DATED : May 24, 2005
INVENTOR(S) : Forbes et al.

It is certified that error appears in the above-identified patent and that said Letters Patent is hereby corrected as shown below:

Column 14,
Line 17, delete "The" and insert -- A --, therefor.

Signed and Sealed this

Twenty-fifth Day of October, 2005

JON W. DUDAS
*Director of the United States Patent and Trademark Office*